United States Patent
Osaka

(10) Patent No.: US 6,809,344 B2
(45) Date of Patent: Oct. 26, 2004

(54) OPTICAL SEMICONDUCTOR DEVICE AND METHOD OF FABRICATING THE SAME

(75) Inventor: Shigeo Osaka, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/396,404

(22) Filed: Mar. 26, 2003

(65) Prior Publication Data

US 2003/0183833 A1 Oct. 2, 2003

(30) Foreign Application Priority Data

Mar. 29, 2002 (JP) ........................................ 2002-098035

(51) Int. Cl.[7] .............................................. H01L 33/00
(52) U.S. Cl. ..................... 257/98; 257/100; 257/101; 257/103; 257/79; 257/452; 257/632; 257/650
(58) Field of Search .................... 257/98, 100, 101, 257/103, 79, 452, 632, 650, 651, 635, 788, 794

(56) References Cited

U.S. PATENT DOCUMENTS

| | | | | |
|---|---|---|---|---|
| 4,317,086 A | * | 2/1982 | Scifres et al. | 372/49 |
| 4,337,443 A | * | 6/1982 | Umeda et al. | 372/49 |
| 5,665,637 A | * | 9/1997 | Chand | 372/46 |
| 6,080,598 A | * | 6/2000 | Kawai | 438/33 |
| 6,323,052 B1 | * | 11/2001 | Horie et al. | 438/46 |
| 6,396,864 B1 | * | 5/2002 | O'Brien et al. | 372/49 |

FOREIGN PATENT DOCUMENTS

| | | | |
|---|---|---|---|
| JP | 59033859 A | * | 2/1984 |
| JP | 7-176819 | | 7/1995 |
| JP | 9-64453 | | 3/1997 |

* cited by examiner

Primary Examiner—Minhloan Tran
Assistant Examiner—Remmon R. Fordé
(74) Attorney, Agent, or Firm—Armstrong, Kratz, Quintos, Hanson & Brooks, LLP

(57) ABSTRACT

An optical semiconductor device includes a laminated layer structure, an intermediate film formed on an end surface of the laminated layer structure, and a passivation film formed on the intermediate film. The passivation film has a quantity of ion projection than that of the intermediate film.

14 Claims, 2 Drawing Sheets

OPTICAL SEMICONDUCTOR DEVICE AND METHOD OF FABRICATING THE SAME

BACKGROUND OF THE INVENTION

1. Field of the Invention

The present invention generally relates to an optical semiconductor device and a method of fabricating the same, and more particularly, to the technique of forming a passivation film on an end surface of a semiconductor laser diode.

2. Description of the Related Art

Recently, many types of high-power semiconductor laser diodes have been proposed. Powerful laser diodes have the problem of catastrophic optical damage (hereinafter simply referred to COD). Power up of the semiconductor laser diodes will not be realized unless a high COD level can be achieved. COD relates to the state of the end surface (facet) of the laser diode. If there is an impurity (for example, natural oxide film) or lattice defect exists on the end surface, light will be absorbed at such defective portions, this absorption resulting in many electrons and holes. Then, the electrons and holes are recombined, which generates heat. Heat thus generated will damage the end surface of the laser diode.

As means for improving the COD level, a proposal of forming a passivation film on the end surface has been known (for example, Japanese Unexamined Patent Publication Nos. 7-176819 and 9-64453). As another practical proposal, it is known to grow a passivation film of alumina ($Al_2O_3$) or silicon oxide ($SiO_2$) by electron beam deposition.

However, there is a limit on improvements of the COD level by alumina and silicon oxide. In order to further improve the COD level, an aluminum nitride (AlN) film may be essential. In order to grow AlN, aluminum and nitrogen are separately supplied in the chamber, then reacting and growing on a laminated layer structure. In growth, nitrogen gas and ions enter into the laminated layer structure containing aluminum via its end surface (facet). The components thus entering into the laminated layer structure roughens the end surface thereof that is originally flat. The rough end surface serves as a light absorption layer and degrades the COD level.

SUMMARY OF THE INVENTION

The present invention has been made in view of the above and provides an optical laser diode and a method of fabricating the same.

A more specific object of the present invention is to effectively prevent components in the passivation film from roughening an end surface of a laminated layer structure of the optical semiconductor device and to thus improve COD.

According to an aspect of the present invention, there is provided an optical semiconductor device comprising: a laminated layer structure; an intermediate film formed on an end surface of the laminated layer structure; and a passivation film formed on the intermediate film, the passivation film having a quantity of ion projection larger than that of the intermediate film.

According to another aspect of the present invention, there is provided a method of fabricating an optical semiconductor device comprising the steps of: (a) forming an intermediate film on an end surface of a laminated layer structure of the optical semiconductor device at a first rate of growth by ion-assisted deposition; and (b) forming a passivation film on the intermediate film at a second rate of growth lower than the first rate of growth by ion-assisted deposition.

According to yet another aspect of the present invention, there is provided a method of fabricating an optical semiconductor device comprising the steps of: (a) forming an intermediate film on an end surface of a laminated layer structure of the optical semiconductor device without ion projection; and (b) forming a passivation film on the intermediate film by ion-assisted deposition.

According to a further aspect of the present invention, there is provided a method of fabricating an optical semiconductor device comprising the steps of: (a) forming an intermediate film that does not contain nitrogen substantially on an end surface of a laminated layer structure of the optical semiconductor device; and (b) forming a passivation film on the intermediate film containing nitrogen.

According to a still further aspect of the present invention, there is provided a method of fabricating an optical semiconductor device comprising a step of growing aluminum nitride on an end surface of a laminated layer structure of the optical semiconductor device while projecting nitrogen ions onto the end surface.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of an embodiment of the present invention with reference to the accompanying drawings.

Figure 1A:
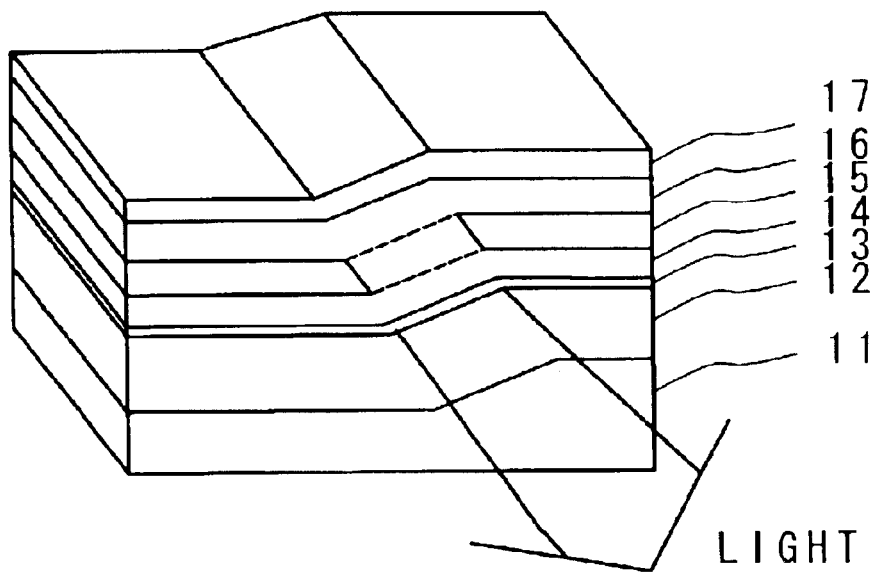
FIG. 1A is a perspective view of an optical semiconductor device.
Figure 1B:
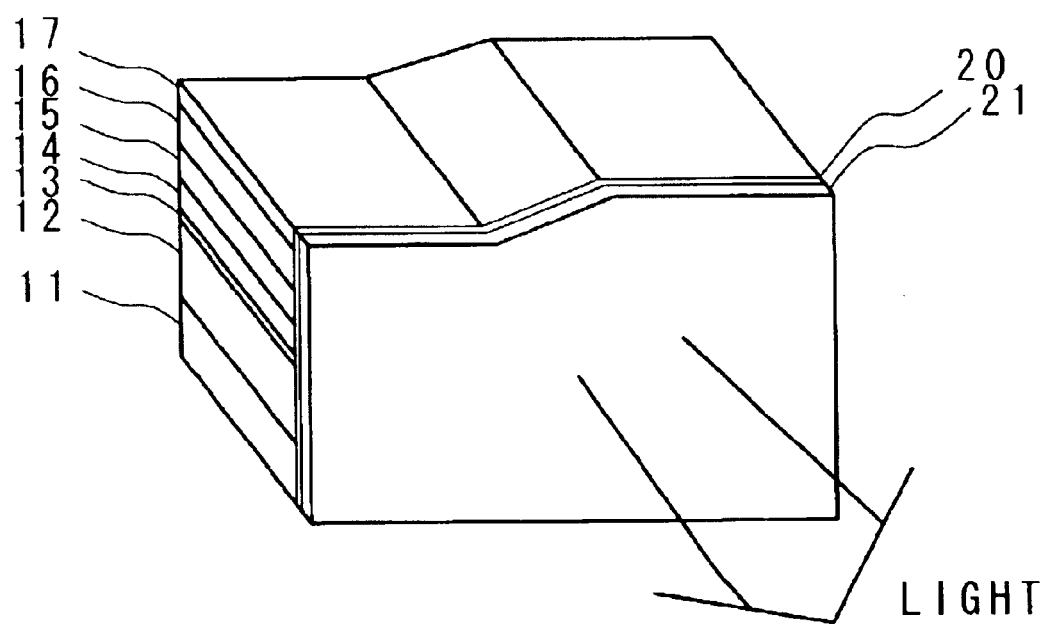
FIG. 1B is a perspective view of an optical semiconductor device according to an embodiment of the present invention.

FIG. 1A is a perspective view of a semiconductor laser diode, and FIG. 1B is a perspective view of a semiconductor laser diode provided by applying a passivation film of the present invention to the laser diode shown in FIG. 1A. The laser diode shown in FIG. 1A has a laminated layer structure, which includes a GaAs substrate 11, an n-type AlGaInP clad layer 12, an MQW (Multi Quantum Well) active layer 13, a first p-type AlGaInP clad layer 14, an AlGaInP current confinement layer 15, a second p-type AlGaInP clad layer 16, and a p-type GaAs contact layer 17. The AlGaInP current confinement layer 15 contains both p-type and n-type impurities. The current confinement layer 15 has a flat portion and a slope portion. The flat and slope portions have different incorporation rates of the impurities, so that the flat portion is of n type and the slope portion is of p type.

An intermediate film 20 and a passivation film 21 are applied to the semiconductor laser diode shown in FIG. 1A according to an embodiment of the present invention. The intermediate film 20 is formed on an end surface (facet) of the laminated layer structure of the laser diode, and the passivation film 21 is formed on the intermediate film 20. The intermediate film 20 functions to prevent ions from roughening the end surface at the time of growing the passivation film 21. In the present embodiment, an ion-assisted deposition method is used to form the passivation film 21, which is made of AlN. In conventional deposition of AlN, the end surface of the laser diode may be damaged. The damaged end surface has fine craters, which absorb light and thus degrade the COD level.

With the above in mind, the present embodiment employs the intermediate film 20 interposed between the end surface of the laser diode and the passivation film 21. In this case, it should be noted that the intermediate film 20 is not required to have nitrogen but may contain silicon (Si), silicon oxide (SiO) or titanium oxide (TiO). However, the use of any of these materials for the intermediate film 20 needs a process different from the process for growing the passivation film 21 of AlN.

Consequently, the present embodiment takes the fabrication process into consideration, and uses the intermediate film 20 made of the same material as that of the passivation film 21. The intermediate film 20 of AlN has a unique structure that enables the intermediate film 20 to prevent ions from roughening the end surface during deposition of AlN for the passivation film 21. The intermediate film 20 and the passivation film 21 can be formed by the same production apparatus. When the intermediate film 20 of AlN is deposited, the end surface of the laser diode will be damaged unless a particular treatment is applied.

In the embodiment being concerned, the intermediate film 20 of AlN is designed to have a refractive index greater than that of the passivation film 21 of AlN. For instance, when the passivation film 21 has a refractive index of 2.07, the intermediate film 20 have a refractive index of, for example, 2.08. The fact that the intermediate film 20 of AlN has a refractive index greater than that of the passivation film 21 of AlN means that the intermediate film 20 has a larger quantity of Al than the passivation film 21. The growth of AlN is done by ion-assisted deposition. The intermediate film 20 and the passivation film 21 may be grown under different conditions of ion-assisted deposition. For example, the intermediate film 20 and the passivation film 21 both made of AlN, are grown at different rates of growth and/or different quantities of ion projection. For example, the films 20 and 21 are formed with a constant quantity of ion projection, and the intermediate film 20 is grown at a rate of growth higher than that of the passivation film 21. In the above manners, the intermediate film 20 and the passivation film 21 that have different refractive indexes can easily be formed. More particularly, the intermediate film 20 may be grown at a comparatively high rate of growth (deposition), and the passivation film 21 may be grown at a comparatively low rate. The higher the rate of growth, the higher the refractive index of the AlN film. Further, the higher the rate of growth, the shorter the laser diode is exposed to nitrogen ions. As the exposed time becomes shorter, the end surface of the laser diode is more unlikely to be exposed to nitrogen ions and be damaged. This prevents degradation of the COD level. In the above-mentioned manner, the intermediate film 20 is grown, and the passivation film 21 is then grown. The end surface of the laser diode is protected from nitrogen ions by the intermediate film 20 during growth of the passivation film 21. Alternatively, the intermediate film 20 may be grown with a comparatively small quantity of projection of nitrogen ions, and the passivation film 21 may be grown with a comparatively large quantity of projection of nitrogen ions.

The intermediate film 20 is preferably 3 nm thick or thinner, and is more preferably 1 nm thick or thinner. The thickness equal to 3 nm is optically negligible. The intermediate film 20 has the lower limit of the thickness that still exhibits the original function of preventing nitrogen ions from entering into the laminated layer structure containing Al during the growth of the AlN passivation film 21. The lower limit of the thickness of the intermediate film 20 depends on various conditions such as the quantity of Al contained in the laminated layer structure. Thus, the lower limit cannot be defined fixedly.

Figure 2:
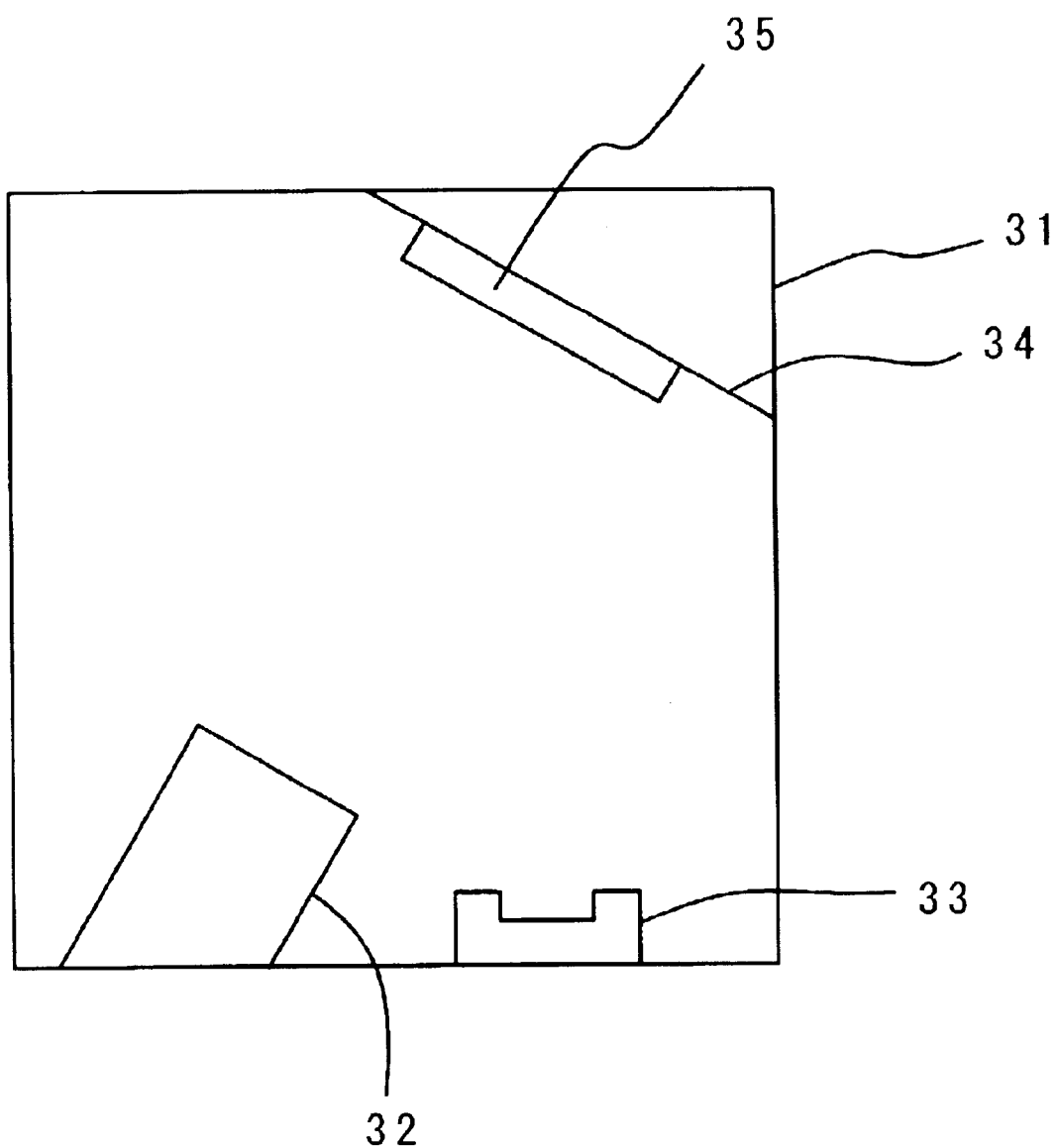
FIG. 2 shows an ion-assisted deposition apparatus.

FIG. 2 is a schematic view of an ion-assisted deposition apparatus, which includes a chamber 31, an ion gun 32, a deposition or evaporation source 33 and a holder 34. The holder 34 holds a plurality of semiconductor substrates 35, which have a bar shape and are cut down from a wafer. Individual laser diode chips are cut down from each of the bar-shaped semiconductor substrates. Hereinafter, the semiconductor substrates held by the holder 34 are referred to as samples 35. The ion gun 32 projects nitrogen ions onto the samples 35. The deposition source 33 is an aluminum source from which aluminum is evaporated toward the samples 35.

The intermediate film 20 and the passivation film 21 are grown by using the ion-assisted deposition device. An electron beam current applied to the evaporation source 33 is set equal to, for example, 60 mA, and a current of 60 mA is applied to the ion gun 32. Under these conditions, evaporant of Al and ion beams of nitrogen are simultaneously applied to the samples 35 for 20 seconds. Next, the current applied to the evaporation source 33 is reduced to 57 mA so that the rate of evaporation can be set at a reduced level, and deposition is carried out for about 30 minutes. Thus, the AlN intermediate film 20 having a refractive index equal to or larger than 2.08 and AlN passivation film 21 having a refractive index of 2.07 can be formed. The AlN intermediate film 20 is 3 nm thick, and the AlN passivation film 21 is 60 nm thick.

Another method may be employed which forms the intermediate film 20 and the passivation film 21 on the end surface of the semiconductor laser diode. For example, a method may be used which includes the first step of forming the intermediate film 20 on the end surface of the laminated layer structure of the semiconductor laser diode without ion projection, and the second step of forming the passivation film 21 on the intermediate film 20 by ion-assisted deposition. The first step may employ vacuum deposition or CVD. The end surface of the laminated layer structure is not subject to ion projection when the intermediate film 20 is deposited, so that the end surface can be prevented from being roughened. Another method may be employed which includes the steps of forming the intermediate film 20 that does not contain nitrogen substantially, and the second step of forming the passivation film 21 containing nitrogen. For example, the intermediate film 20 formed by the first step may be $SiO_2$ or $TiO_2$ deposited by CVD. The second step may employ ion-assisted deposition or vacuum deposition. Since the intermediate film 20 does not contain aluminum, it is possible to avoid a possibility of combination with Al contained in the laminated layer structure.

The intermediate film 20 and the passivation film 21 can be applied to a light emitting end surface via which light outgoes but also a light incoming end surface via which light comes into the laminated layer structure.

The present invention is not limited to the above-mentioned types of semiconductor laser diodes, but includes other types. The concept of the use of the intermediate film 20 and the passivation film 21 may be applied to not only semiconductor laser diodes but also other types of optical semiconductor devices. The present invention includes methods of fabricating these various types of optical semiconductor devices.

The present invention is based on Japanese unexamined patent application no. 2002-098035, the entire disclosure of which is hereby incorporated by reference.

What is claimed is:

1. An optical semiconductor device comprising:
   a laminated layer structure;
   an intermediate film formed on an end surface of the laminated layer structure; and
   a passivation film formed on the intermediate film,
   the passivation film having a quantity of ion projection larger than that of the intermediate film.

2. The optical semiconductor device according to claim 1, wherein the intermediate film comprises a film formed by ion-assisted deposition.

3. The optical semiconductor device according to claim 2, wherein the intermediate film and the passivation film have a constant quantity of ion projection from an ion source, and the intermediate film has a rate of growth higher than that of the passivation film.

4. The optical semiconductor device according to claim 2, wherein the intermediate film has a quantity of ion projection from the ion source smaller than that of the passivation film.

5. The optical semiconductor device according to claim 1, wherein the intermediate film has not been subject to ion projection.

6. The optical semiconductor device according to claim 1, wherein the intermediate film and the passivation film are made of aluminum nitride, and the intermediate film has a refractive index larger than that of the passivation film.

7. The optical semiconductor device according to claim 1, wherein the passivation film is made of aluminum nitride, and the intermediate film has no nitrogen.

8. The optical semiconductor device according to claim 1, wherein the intermediate film and the passivation film are made of aluminum nitride, and have different conditions for film growth.

9. The optical semiconductor device according to claim 1, wherein the intermediate film is 3 nm thick or thinner.

10. The optical semiconductor device according to claim 1, wherein the intermediate film is 1 nm thick or thinner.

11. The optical semiconductor device according to claim 1, wherein the optical semiconductor device receives or emits light via the end surface.

12. The optical semiconductor device as claimed in claim 1, wherein the passivation film is a film formed by ion-assisted deposition.

13. The optical semiconductor device as claimed in claim 1, wherein the passivation film is a film formed by ion-assisted deposition and the intermediate film is a film formed by ion-assisted deposition.

14. The optical semiconductor device as claimed in claim 1, wherein the passivation film is a film formed by ion-assisted deposition and contains a component that is an ionized component in the ion-assisted deposition.

* * * * *